United States Patent [19]

Kuo

[11] Patent Number: 4,766,473
[45] Date of Patent: Aug. 23, 1988

[54] SINGLE TRANSISTOR CELL FOR ELECTRICALLY-ERASABLE PROGRAMMABLE READ-ONLY MEMORY AND ARRAY THEREOF

[75] Inventor: Clinton C. K. Kuo, Austin, Tex.

[73] Assignee: Motorola, Inc., Schaumburg, Ill.

[21] Appl. No.: 947,213

[22] Filed: Dec. 29, 1986

[51] Int. Cl.[4] .......................................... H01L 29/78
[52] U.S. Cl. ................................. 357/23.5; 357/41; 357/54; 365/185
[58] Field of Search .................. 357/23.5, 41, 54; 365/185

[56] References Cited

U.S. PATENT DOCUMENTS

| | | | |
|---|---|---|---|
| 4,317,272 | 3/1982 | Kuo et al. | 357/23.5 |
| 4,668,970 | 5/1987 | Yatsuda et al. | 365/185 |
| 4,691,216 | 9/1987 | Terada et al. | 357/23.5 |

OTHER PUBLICATIONS

"How Seeq is Pushing EEPROMS to 1-Mb Densities", Electronics, Aug. 21, 1986, pp. 53-56.

Primary Examiner—Joseph E. Clawson, Jr.
Attorney, Agent, or Firm—John A. Fisher; Jeffrey Van Myers; Jonathan P. Meyer

[57] ABSTRACT

A single transistor EEPROM cell comprises a source, a channel, a drain, a floating gate and a control gate. The control gate and the floating gate are co-extensive over the channel. Programming is achieved by charge injection from the channel and erasing is achieved by tunneling to the source. An array organization is disclosed which features a source/erase control line shared between two adjacent rows of the array, providing efficient byte-at-a-time erasing. An erasure scheme is disclosed which involves repetitive erase pulse-read-erase pulse cycles together with means for assuring complete erasure while preventing over-erasure from driving any cell in the array into depletion mode.

4 Claims, 5 Drawing Sheets

SINGLE TRANSISTOR CELL FOR ELECTRICALLY-ERASABLE PROGRAMMABLE READ-ONLY MEMORY AND ARRAY THEREOF

RELATED APPLICATIONS

This application is related to a co-pending application bearing Ser. No. 947,212, filed of even date herewith and assigned to the assignee of the present invention.

FIELD OF THE INVENTION

The present invention relates, in general, to electrically-erasable, programmable read-only memories (EEPROM's). More particularly, the invention relates to a single transistor cell for EEPROM's and to an array of such cells forming an EEPROM.

BACKGROUND OF THE INVENTION

An EEPROM cell varies the charge stored on a floating gate in order to vary the threshold voltage, $V_T$, of a floating gate-type MOS transistor comprising a source, a drain, the floating gate and a control gate. For present purposes, an EEPROM cell is said to be "erased" when the $V_T$ of the transistor is less than some predetermined switch point voltage, $V_{TSP}$. The cell is said to be "programmed" when the $V_T$ of the cell is greater than $V_{TSP}$. As is familiar, $V_{TSP}$ is chosen to be less than the positive supply voltage $V_{DD}$ in static arrays and is approximately equal to $V_{DD}$ in dynamic arrays. Making the charge stored on the floating gate more positive decreases the $V_T$ of the transistor and making the charge stored on the floating gate more negative increases the $V_T$ of the transistor. As is familiar, charge is added to or removed from the floating gate by tunneling, channel hot carrier injection, avalanche injection or other techniques.

Nearly every commercially successful EEPROM uses at least two transistors per cell. In addition to the floating gate-type device, a series select transistor is present in each cell to alleviate the problem of read errors caused by over-erasure. Because the erasure process is not self-limiting, it is likely that too much negative charge will be removed from (or positive charge added to) the floating gate when the cell is erased, rendering the $V_T$ of the transistor negative (in other words, making it a depletion-mode device). Without series select transistors used for read access, such depletion-mode devices cause read errors when any other cell on the shared bit-line is accessed.

The required use of select transistors in EEPROM's limits the desired increase in density of such devices. Therefore, attempts have been made to overcome this problem. U.S. Pat. No. 4,451,905 (hereinafter, the '905 patent) discloses an EEPROM cell and array using a single transistor design. The approach of the '905 patent is to add extra decoders and an extra (−5V) power supply outside of the array itself to ensure that read errors are avoided. This saves area in the array itself, but may require just as much added area in the extra decoders and power supply.

U.S. Pat. No. 4,317,272 (hereinafter, the '272 patent) discloses a two transistor EEPROM cell in which the two transistors are, to the greatest extent possible, merged together. This saves a certain amount of area, but is still limited to a two transistor design. U.S. Pat. No. 4,486,769 (hereinafter, the '769 patent) discloses what is apparently a single transistor EEPROM cell design. However, a complex triple poly (three layers of polysilicon) process, an additional bias electrode and four connections to each cell (as opposed to the more conventional three) are required by this design. No mention of a solution to the over-erasure problem is made in the '769 patent.

SUMMARY OF THE INVENTION

Accordingly, it is an object of the present invention to provide an improved single transistor EEPROM cell and an array thereof.

It is a further object of the present invention to provide a single transistor EEPROM cell and an array thereof which is not subject to read errors caused by over-erasure of cells therein.

These and other objects and advantages of the present invention are provided by an EEPROM cell comprising a semiconductor body predominantly of a first conductivity type; source and drain regions of a second conductivity type at a first face of said body, the source and drain regions being separated by a channel region of said first conductivity type; a floating gate formed of patterned conductive material overlying and isolated from said semiconductor body, the floating gate overlying said channel region and a portion of said source region; tunnel means for selectively providing a conduction path between said source region and said floating gate; and a control gate formed of patterned conductive material overlying and isolated from said semiconductor body and said floating gate, the floating gate and the control gate being co-extensive over the channel region.

These and other objects and advantages of the present invention will be apparent from the detailed description below taken together with the drawings.

DETAILED DESCRIPTION OF THE INVENTION

The following description involves the structure and function of an N-channel EEPROM cell and array. That is, the structures are fabricated in a semiconductor substrate which is of predominantly P-type conductivity with N-type regions therein forming the source and drain regions. Those skilled in the art will recognize that while this is, by far, the most common choice for EEPROM's, it is also possible to reverse the conductivities and fabricate a P-channel EEPROM array.

Figure 1:
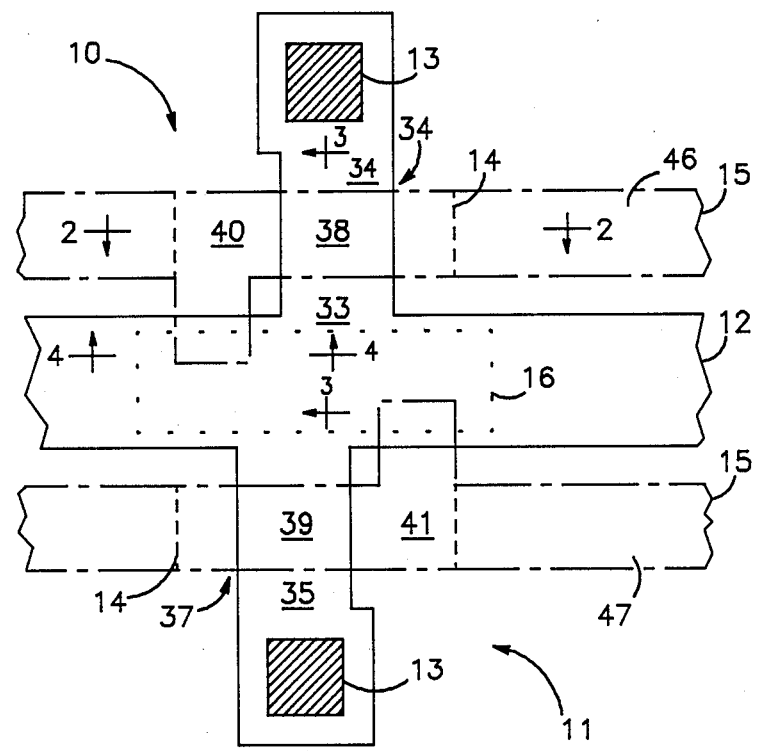
FIG. 1 is a plan view illustrating the layout of a single transistor EEPROM cell according to one aspect of the present invention.
Figure 2:
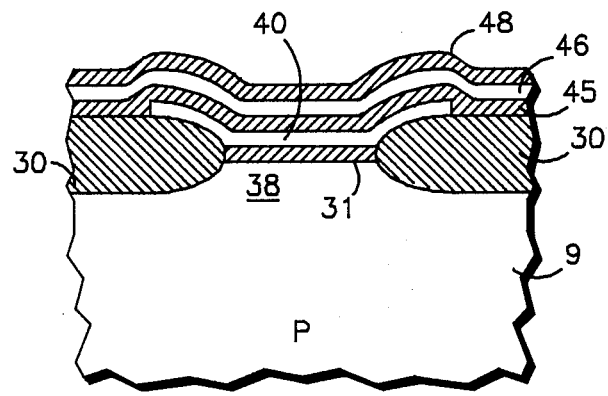
FIG. 2 is a cross-sectional view, taken along the indicated plane, of the device of FIG. 1.
Figure 3:
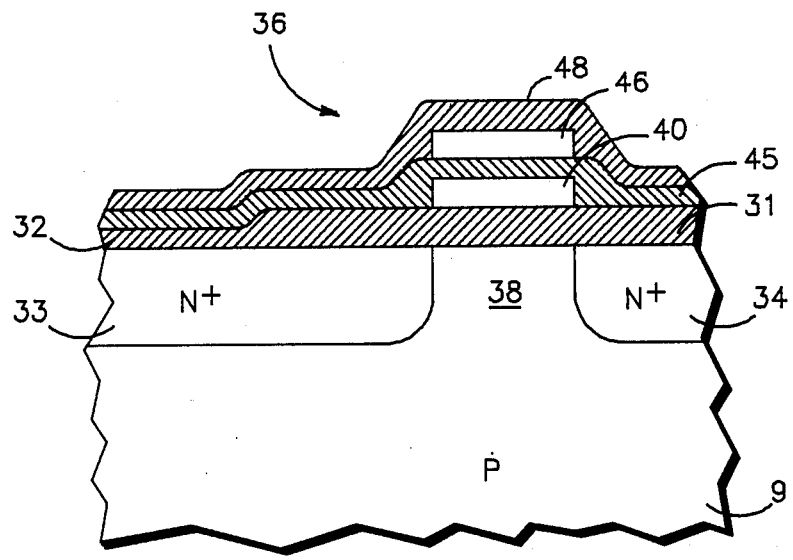
FIG. 3 is a cross-sectional view, taken along the indicated plane, of the device of FIG. 1.
Figure 4:
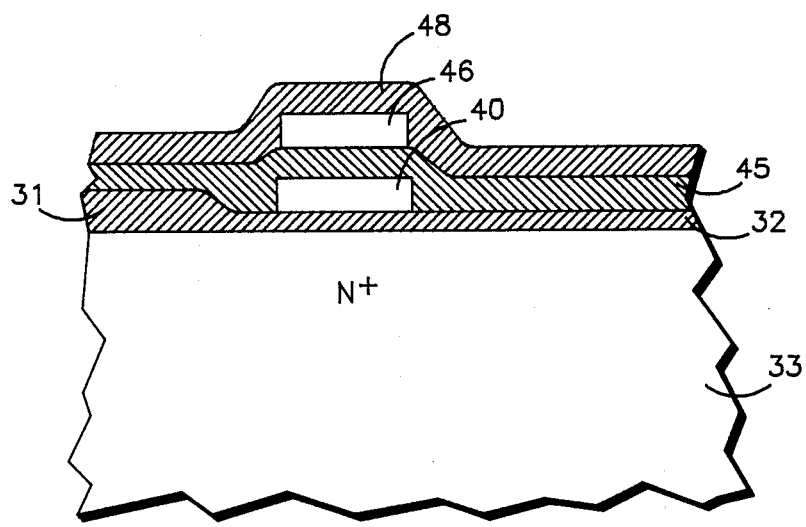
FIG. 4 is a cross-sectional view, taken along the indicated plane, of the device of FIG. 1.

FIGS. 1–4 illustrate, in various views as set forth above, the layout and structure of an EEPROM cell according to one aspect of the present invention. FIG. 1 is a conventional depiction of the geometric shapes which comprise the outlines of the various masks used to fabricate the device according to standard semiconductor industry practice.

FIG. 1 actually depicts a portion of an EEPROM array including two cells 10 and 11. The structure and function of EEPROM cells according to the present invention encourage the sharing of certain features between two cells, as will be more apparent from the following discussion. From a purely geometric viewpoint, FIG. 1 comprises a first outline 12, a pair of second outlines 13, a pair of third outlines 14, a pair of fourth outlines 15 and a sixth outline 16.

First outline 12 defines the "active area" of cells 10 and 11. The surface of a P-type semiconductor substrate 9 outside of outline 12 is covered with a relatively thick (thousands of Angstroms) field oxide. In addition, common practice includes the formation of relatively heavily doped channel stop regions underlying all or part of the field oxide. The surface inside outline 12 is covered by a relatively thin (hundreds of Angstroms) gate oxide 31, except for the surface inside outlines 13, which is exposed to allow contact with a metal interconnection line, and the surface inside outline 16, which is covered by a very thin (on the order of 100 Angstroms) tunneling oxide layer 32. The formation of these oxide layers of varying thickness is performed according to techniques well known in the semiconductor industry.

In addition to defining the active region of cells 10 and 11, outline 12 defines the extent of the N-type diffusions or implants which form the source 33 and drains 34 and 35 of the single transistors 36 and 37 of cells 10 and 11, respectively. As is apparent, source 33 is shared between cells 10 and 11. All of the area inside outline 12 is of N-type conductivity except for channel regions 38 and 39, which are defined as the areas of substrate 9 underlying the intersections of outlines 12 and 15. Alternatively, it is possible that some portions of the active region, particularly surrounding drains 34 and 35, may be lightly doped with a P-type dopant, typically by means of ion implantation, to enhance the programming mechanism.

Outlines 14 define the extent of floating gates 40 and 41. In fact, outlines 14 define the extent of the floating gates after a self-aligned etch step which patterns the overlying control gates has been performed, not the actual mask layer which initially patterns the conductive material which forms the floating gates. Floating gates 40 and 41 are fabricated according to familiar techniques by depositing and patterning a first conductive layer, most commonly a doped polysilicon layer, overlying oxides 30, 31 and 32. Floating gates 40 and 41 overlie channels regions 38 and 39, respectively. Stored charge on floating gates 40 and 41 is the source of the electric fields which alter the conductivity of channel regions 38 and 39, respectively, thus altering the threshold voltages of transitors 36 and 37, respectively.

Outlines 14 also extend to intersect a portion of outline 12, so that floating gates 40 and 41 extend beyond channel regions 38 and 39 and over a portion of source 33. Outline 16 defines an area in which floating gates 40 and 41 overlie source 33 and in which the relatively thicker gate oxide 31 overlying the remainder of source 33 is replaced by the relatively thinner tunneling oxide 32. Erasure of cells 10 and 11 occurs by the tunneling of electrons from floating gates 40 and 41 through tunneling oxide 32 to source 33, as is described in greater detail below.

Immediately overlying floating gates 40 and 41 is a layer of dielectric material 45. Dielectric material 45 serves to electrically isolate floating gates 40 and 41 from any overlying conductive material. Dielectric 45 may be a deposited dielectric, such as CVD oxide or an oxide-nitride-oxide (ONO) multi-layer structure. It is also possible that dielectric 45 can be formed by thermally oxidizing the polysilicon of floating gates 40 and 41.

Outlines 15 define the pattern of a second layer of conductive material, commonly another layer of doped polysilicon, which overlies dielectric material 45 and forms control gates 46 and 47. Control gates 46 and 47 overlie floating gates 40 and 41, respectively, over channel region 38 and over source 33. Control gates 46 and 47, as is familiar, serve to influence the potential of floating gates 40 and 41, respectively, during the programming and erasing of the cells and as the select gates during the reading of the cell. In a preferred embodiment of the invention, which involves a particular EEPROM array organization disclosed below, control gates 46 and 47 are shared among each of the cells along a word line, or row, of the array, and source 33 is shared among 16 cells (two bytes) which form portions of two adjacent rows. The portion of control gates 46 and 47 which overlie floating gates 40 and 41, respectively, are co-extensive therewith. That is, there is no portion of channel region 38 or 39 which is not overlain by both a floating gate and a control gate.

Immediately overlying control gates 46 and 47 is a second layer 48 of dielectric material which is similar to dielectric layer 45. Dielectric layer 48 serves to electrically isolate control gates 46 and 47 from overlying conductive layers such as metal lines and, of course, is opened where electrical contact thereto is required.

Figure 5:
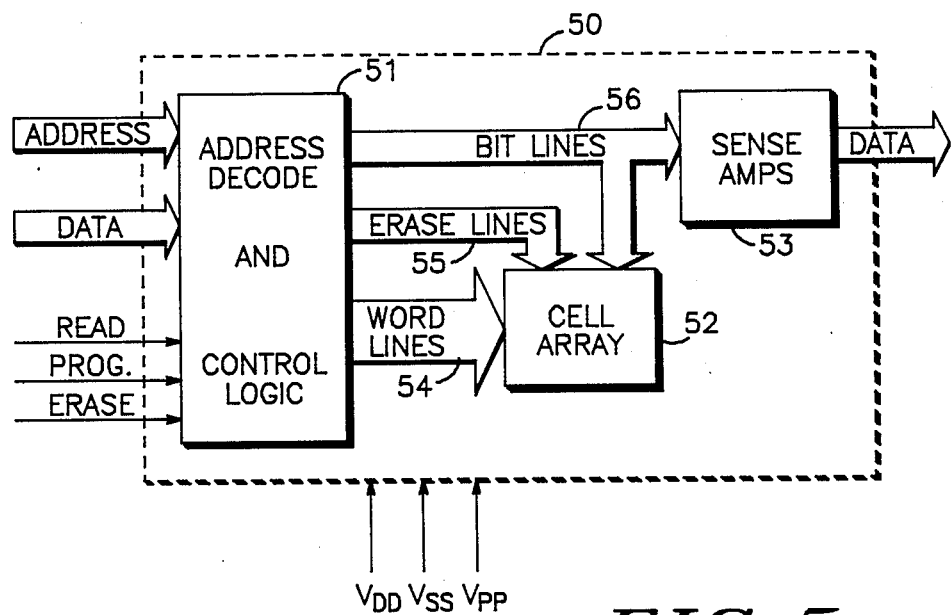
FIG. 5 is a simplified schematic illustration of an EEPROM according to one aspect of the present invention.

The function of an array of EEPROM cells such as just been described structurally with reference to FIGS. 1-4 may be better understood by first considering FIG. 5, which depicts, in greatly simplified block diagram form, an EEPROM 50. EEPROM 50 is a hypothetical device which accepts a predetermined number of address bits, a predetermined number of data bits, three control signals (READ, PROGRAM and ERASE) and three power supply voltages ($V_{DD}$, $V_{PP}$ and $V_{SS}$) as inputs and provides a predetermined number of data bits as outputs. Typically, $V_{DD}$ is approximately $+5V$, $V_{PP}$ is in the range of $+12V$ to $+20V$ and $V_{SS}$ is ground, or 0V.

Internally, EEPROM 50 comprises address decode and control logic 51, an array 52 of EEPROM cells, a plurality of sense amplifiers 53, a plurality of word lines 54 which couple control logic 51 to array 52, a plurality of erase lines 55 which couple control logic 51 to array 52 and a plurality of bit lines 56 which couple array 52 to control logic 51 and to sense amplifiers 53. Addresses are decoded in logic 51 to provide the identity of the particular word line being addressed (X-decoded) and to provide the identity of the particular set of bit lines (or column) being addressed (Y-decoded). As is described in greater detail below, the decoding is followed by applying signals to array 52 over word lines 54, erase lines 55 and/or bit lines 56 as are appropriate to the operation specified by the control signals applied to logic 51.

Figure 6:
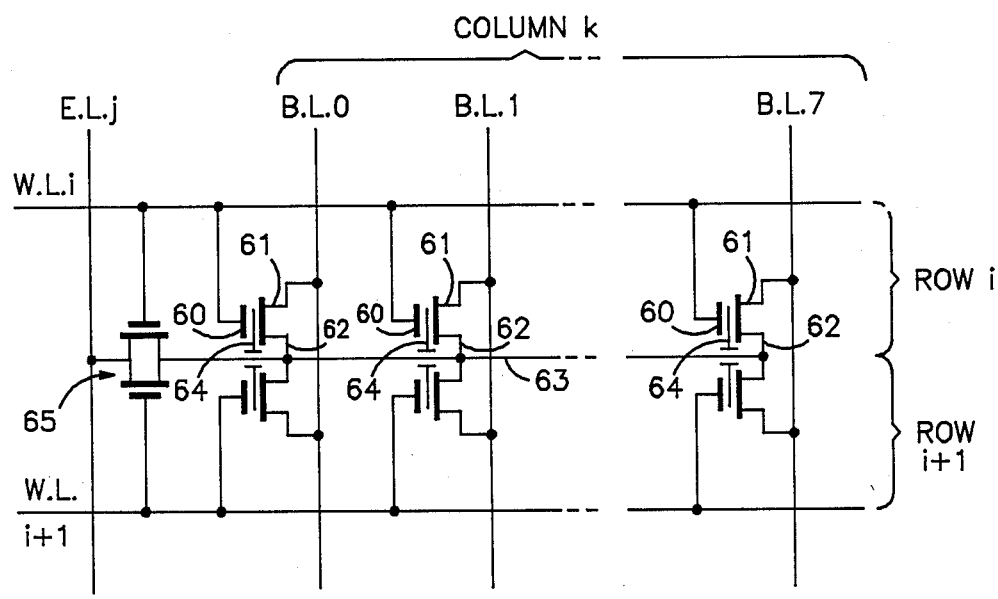
FIG. 6 is a detailed schematic illustration of a portion of an EEPROM array according to one aspect of the present invention.

FIG. 6 illustrates portions of a pair of rows (row i and row i+1) of cell array 52 of FIG. 5. FIG. 6 illustrates a preferred embodiment of the present invention in which the cells are organized so as to be conveniently erased one byte at a time. This byte-erasure scheme is the subject of the claims of co-pending U.S. patent application Ser. No. 947,212 assigned to the assignee of the present invention.

FIG. 6 illustrates just one byte (comprising column k of array 52) along each of rows i and i+1. As is familiar in the art, each row extends across the entire width of array 52 and has more than one byte along its length. The interconnections to row i, column k of the array are word line i, erase line j and bit lines 0-7. Erase line j, in the preferred embodiment, is Y-decoded along with bit lines 0-7, and is shared by all rows in column k. Word lines i and i+1, on the other hand, extend across the entire width of the array and are shared by all the columns thereof.

Each of the eight cells comprising row i, column k of the array comprises a floating gate-type N-channel transistor as is described above. Each transistor comprises a control gate 60, a drain 61, a source 62 and a floating gate 64. Control gates 60 are each connected to word line i, drains 61 are each connected to one of bit lines 0-7, respectively, and sources 62 are each connected to a common source/erase control line 63. In addition, each floating gate 64 is selectively coupled, during erase cycles, by tunneling to common source/erase control line 63. Common source/erase control line 63 is shared by each cell in column k along rows i and i+1, but does not extend into column k+1. This arrangement provides the desired byte-at-a-time erase and program features. If only row-at-a-time erase and program is desired, then common source/erase control line 63 may be extended across the entire width of the array and only one erase line would be required. Common source/erase control line 63 is connected to a source of an N-channel, enhancement-type transistor 65. The gate of transistor 65 is connected to word line i and the drain is connected to erase line j.

Figure 7B:
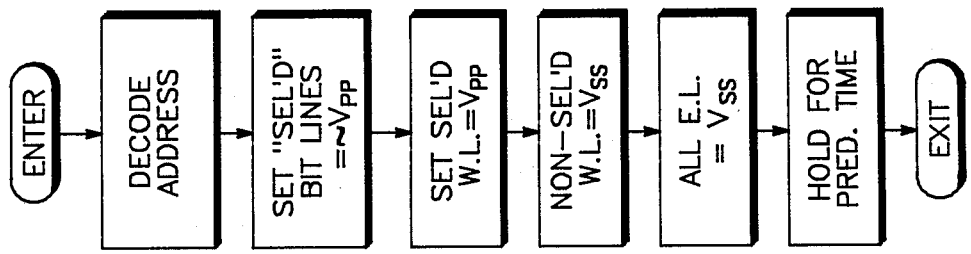
FIGS. 7A–7C are flow charts illustrating the operation of an EEPROM array according to one aspect of the present invention.
Figure 7A:
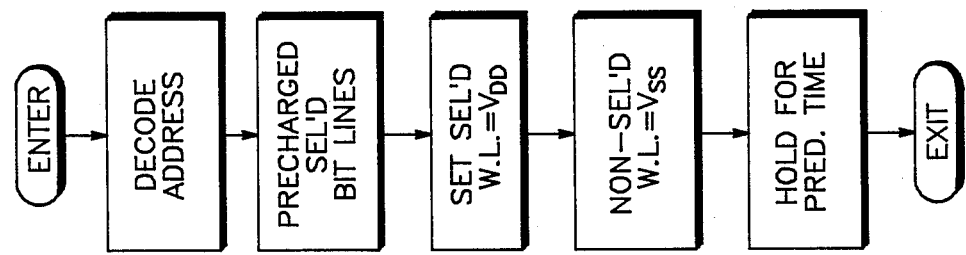
Figure 7C:
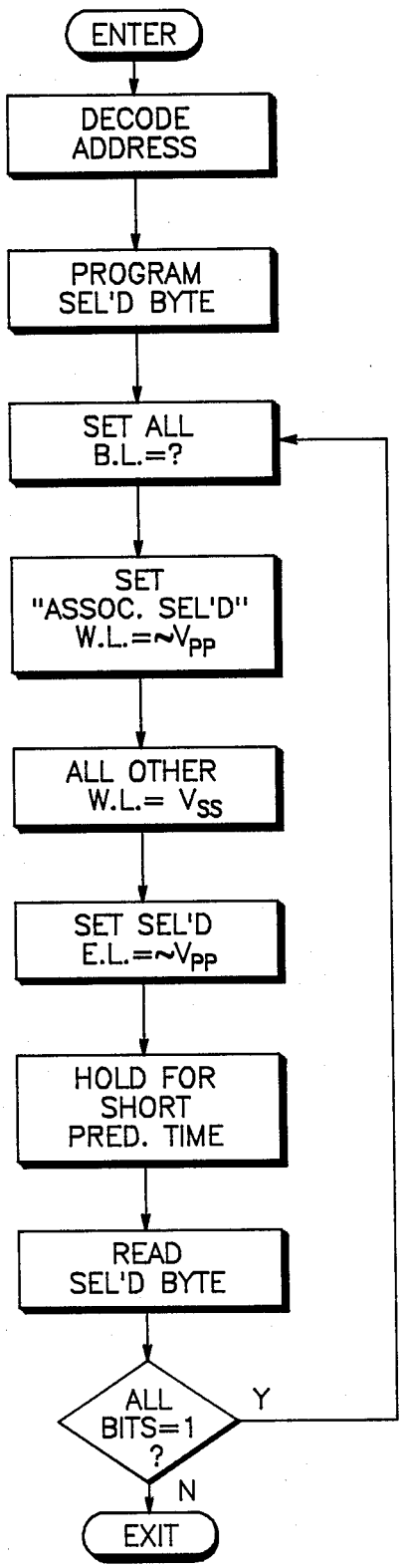

Reading, programming and erasing the EEPROM described with reference to FIGS. 5 and 6 are all accomplished, in some sense, one byte at a time. FIGS. 7A, 7B and 7C are flow charts illustrating the read, program and erase sequences, respectively. In practice, as will be apparent to one skilled in the art, the sequences illustrated may not be as linear as is implied by a flow chart representation. In other words, events represented as occurring sequentially may, in fact, occur simultaneously.

Referring to FIG. 7A, a read sequence for the above-described EEPROM is illustrated. References to structural elements will be with respect to FIGS. 5 and 6. First, logic 51 responds to the assertion of the READ control signal by decoding the address on the address bus. This results in the identification of the word line, i, which corresponds to the row of the array to be read and of the particular set of bit lines 0-7 comprising the column, k, which is to be read. In a typical dynamic array, all of the bit lines have been precharged to a voltage level of approximately $V_{DD}$ (typically, +5V). After the precharging is terminated, the selected word line, i, is set to approximately $V_{DD}$ and all non-selected word lines are set to $V_{SS}$ (typically 0V or ground). Static operation, in which no precharging of the selected bit lines is performed, is also possible at the cost of increased access time.

Setting the selected word line to $V_{DD}$ both raises the control gates of each of the cells on the word line to $V_{DD}$ and "turns on" the N-channel erase select transistor (e.g. 65 of FIG. 6) through which each cell's source 62 is coupled to erase line j. All erase lines are at $V_{SS}$, providing a path to ground for the charge on the bit lines. Those cells which have been previously erased, thus lowering their $V_T$'s to a value below $V_{TSP}$ (which, in a dynamic array is approximately $V_{DD}$), will discharge their associated bit lines, which is sensed by the associated sense amplifier. Cells which have been previously programmed, thus having $V_T$'s above $V_{TSP}$, will not significantly discharge their associated bit lines. The read configuration is held for a time predetermined to allow accurate reading of the array, then the read sequence is terminated.

FIG. 7B illustrates a program sequence for the above-described EEPROM. Logic 51 responds to the assertion of the PROGRAM control signal by first decoding the address to determine the identity of the selected row and column, i and k, respectively. Since a data word to be stored in row i of array 52 will typically be a combination of high and low logic values, programming must be responsive to the value of the data word received to determine which bits within the selected column are to be programmed. In the case of pre-programming preparatory to erasing (see below) all bits within the selected column will be programmed. Otherwise, data from the data bus will be used to determined which bits are to be programmed and which are not. For this reason, FIG. 7B indicates that the "selected" bit lines are set to approximately $V_{PP}$. This indicates that the bit lines must both be selected by the Y-decode process and must correspond to a bit in the input data word with the appropriate value.

In order, for instance, to program the cell at the intersection of word line i and bit line 0, bit line 0 is set to approximately $V_{PP}$. The selected word line, i, is also set to approximately $V_{PP}$. In both cases, the actual value applied will be slightly lower than $V_{PP}$ due to threshold voltage drops through the intervening circuits. It is advantageous to design the circuits such that the actual voltage applied to the bit line is lower than the actual voltage applied to the control gate, or word line. This provides the proper electric field to cause electrons to move toward the floating gate. Non-selected word lines are set to $V_{SS}$. All erase lines are set to $V_{SS}$, thus creating a large voltage drop from drain to source in the cell being programmed. This condition, combined with the large positive voltage on the selected control gate, serves to inject electrons into the selected floating gate, leaving it with a more negative charge and raising the $V_T$ of the cell.

In programming an EEPROM cell, the minimum length of time necessary to inject sufficient charge onto the floating gate to raise the cell threshold voltage to the desired level is not easily predictable. Processing variations cause the required programming time to change from device to device and even between cells on a single device. One common technique is simply to hold the programming voltage levels in place for a length of time sufficient to ensure that the $V_T$ of the "worst case" cell is raised above $V_{TSP}$. Another well known sequence involves repeated, shorter write cycles with intervening read cycles, under the control of an outside processor or the internal control logic. When the target cell or cells read as programmed, one or more "extra" write cycles are executed to provide a margin, and then the process is terminated. In any case, a normal program sequence will be terminated when the $V_T$'s of the target cells are above $V_{TSP}$, but usually before the $V_T$'s reach the point at which charge build-up on the floating gates prevents the injection of more charge. This is done to make programming time as short as is reasonably possible.

FIG. 7C illustrates an erase sequence for the above-described array. In response to the assertion of the ERASE control signal, logic 51 first decodes the address. In the case of the preferred embodiment organization described above, an erase line selection must be made in addition to the usual row and column selections. This requires no additional logic since the erase line selection is performed by the same logic (the Y-decoder) as the column selection. This selection is avoided if only row-at-a-time erasing is performed, in which case all erase lines may be treated identically, or there will be only one erase line.

Prior to erasing the selected byte, it must first be programmed, so that all of the cells have a high $V_T$. A program sequence is executed with each bit line in the selected column set to approximately $V_{PP}$. In addition, the program voltages are advantageously held for a longer than usual time so that the cells tend to reach or approach the self-limiting value of $V_T$. This decreases the spread in threshold voltages ($\wedge V_T$) which is the natural result of variations in properties and history among the cells. Next, all bit lines are allowed to float, or assume an undetermined voltage and a high input impedance. The "associated word line", which is the word line which shares a common source/erase line with the selected word line, is set to approximately $V_{PP}$. In the case of word line i, the associated word line is i+1. All other word lines, including the selected word line, are set to $V_{SS}$. The selected erase line, j, is set to approximately $V_{PP}$.

Once the erase voltages have been set up as described, each cell along the selected row has a low voltage on the control gate and a high voltage on the source, which encourages the tunneling of electrons off of the floating gate toward the source, through the tunneling oxide area, thus tending to lower the threshold of the cell. This condition is maintained for a predetermined, but very short, time. The hold time is selected in light of the programming characteristics of the particular cells, but is advantageously sufficient to alter the $V_T$'s no more than one-quarter to one-half volt. For instance, the hold time may be approximately 10 to 100 microseconds.

Following the erase pulse, the selected byte is read according to the sequence described above. If any bits still read as programmed, then another erase pulse will be executed. If no cell reads as programmed, then the sequence will be terminated. Using this erase sequence depends upon a sufficient margin between $V_{TSP}$ and the point at which a cell has a negative threshold voltage to ensure that when the "last" cell in the selected byte is erased the "first" cell will not yet have acquired a negative $V_T$. For example, in a fairly typical static array, the expected threshold voltage spread, $\wedge V_T$, may be approximately 1 volt, $V_{TSP}$ may be approximately 3 volts, and the erase pulse length may be chosen to alter $V_T$ no more than 0.5 volts per pulse, and one would expect the array to function properly. In other words, when the "last" cell's $V_T$ falls below $V_{TSP}$, the "first" cell's $V_T$ would be no lower than approximately $V_{TSP}$ minus $\wedge V_T$, or 2 volts. Since at least four more erase pulses would be necessary to drive the $V_T$ of the "first" cell negative, a sufficient margin is present. Trading off such design parameters to achieve a stable result is a familiar role for designers and need not be further illustrated here.

At least one alternate method of erasing single transistor EEPROM cells while avoiding over-erasure exists. In this alternate method, the read sequence following each erase pulse is altered by leaving all word lines at approximately $V_{SS}$. Thus, any cell which reads as erased has a $V_T$ of zero or less. A further modification or the read sequence is performed by slightly altering the bias of the sense amplifiers so that a cell reads as erased with a slightly higher $V_T$ than is the case with normal sense amplifier biasing. This assures that the "first" cell will be detected as erased while its threshold (with the control gate grounded) is still slightly positive. In this alternate method, the erase sequence is terminated when the "first" cell reads as erased, depending on the margins discussed above to assure that the $V_T$ of the last cell is below $V_{TSP}$.

No doubt, other erase sequences and variations are possible which rely on the principle of performing multiple, short erase pulses with intervening read sequences for the purpose of terminating the erase sequence before any cell in the selected byte (or word, or entire array) has acquired a negative $V_T$. Such a scheme is one way to make practical the use of single transistor EEPROM cells. In addition, since the user need not tolerate a uniform erase time chosen to ensure erasure of the "worst case" cell, many erase sequences will be shorter than with prior art EEPROM arrays.

An EEPROM cell and array have been disclosed which offer a number of significant advantages over previous such cells and arrays. The cell is a true single transistor EEPROM cell and uses only manufacturing techniques which are familiar in the semiconductor industry. The disclosed cell offers significantly higher density than previous EEPROM cells. The array disclosed is efficiently organized to provide the capability of row and/or single byte erasing, thus offering speed advantages over EEPROM arrays which must be bulk erased in order to change stored values in any particular byte. In addition, the disclosed array and method of erasure, which prevents over-erasure rather than compensating for its effects, offers the possibility of faster and more reliable operation.

While the present invention has been particularly shown and described with reference to a particular embodiment thereof, various modifications and changes thereto will be apparent to one skilled in the art and are within the spirit and scope of the present invention.

I claim:

1. An EEPROM cell comprising:
a semiconductor body predominantly of a first conductivity type;
source and drain regions in said body at a first face thereof, said source and drain regions being of a second conductivity type, said source region being disposed generally along a first line and said drain region being spaced from said source region along a second line approximately perpendicular to said first line;
a channel region in said body at said first face thereof separating said source and drain regions, said channel region being of said first conductivity type;
a floating gate formed of patterned conductive material overlying and isolated from said body, said floating gate overlying said channel region and a portion of said source region;

tunnel oxide means for selectively providing a tunneling path between said floating gate and said source, said tunnel oxide means being in a position removed from said second line; and a control gate formed of patterned conductive material overlying and isolated from said floating gate and said body, said control gate and said floating gate being co-extensive over said channel region and over said tunnel oxide means.

2. An EEPROM cell according to claim 1 further comprising:

a second drain region of said second conductivity type in said body at said first face thereof, said second drain region being disposed opposite said first drain region across said source region;

a second channel region in said body at said first face thereof separating said second drain region from said source region, said second channel region being of said first conductivity type;

a second floating gate formed of patterned conductive material overlying and isolated from said body, said second floating gate overlying said second channel region and a portion of said source region, said tunnel means also selectively providing a tunneling path between said second floating gate and said source region; and second control gate means formed of patterned conductive material overlying and isolated from said body, said second control gate and said second floating gate being coextensive over said second channel region.

3. An EEPROM cell according to claim 1 wherein said tunnel means further comprises:

a first layer of oxide separating said source region and said floating gate.

4. An EEPROM cell according to claim 2 wherein said tunnel means further comprises:

a first layer of oxide separating said source region and said floating gate.

* * * * *